United States Patent [19]
Cutsogeorge

[11] 4,224,536
[45] Sep. 23, 1980

[54] STABILIZATION OF MONOLITHIC INTEGRATED CIRCUIT OUTPUT LEVELS

[75] Inventor: George A. Cutsogeorge, Princeton, N.J.

[73] Assignee: RCA Corporation, New York, N.Y.

[21] Appl. No.: 899,594

[22] Filed: Apr. 24, 1978

[51] Int. Cl.[2] .............................................. H03K 1/02
[52] U.S. Cl. .................................... 307/297; 307/303; 307/310
[58] Field of Search ............... 307/237, 264, 296, 297, 307/303, 310

[56] References Cited

U.S. PATENT DOCUMENTS

| | | | |
|---|---|---|---|
| 3,546,481 | 12/1970 | Talley | 328/150 X |
| 3,703,651 | 11/1972 | Blowers | 307/297 X |
| 3,743,850 | 7/1973 | Davis | 307/297 X |

*Primary Examiner*—John Zazworsky
*Attorney, Agent, or Firm*—Samuel Cohen; Robert L. Troike; Donald W. Phillion

[57] ABSTRACT

One of several monolithically integrated circuits acts as a control element or sensor to supply a signal to control the power supply voltage so as to maintain a predetermined output level from the other monolithically integrated circuits. A separate output circuit converts an unstable data signal into an output signal having precisely controlled output levels.

4 Claims, 1 Drawing Figure

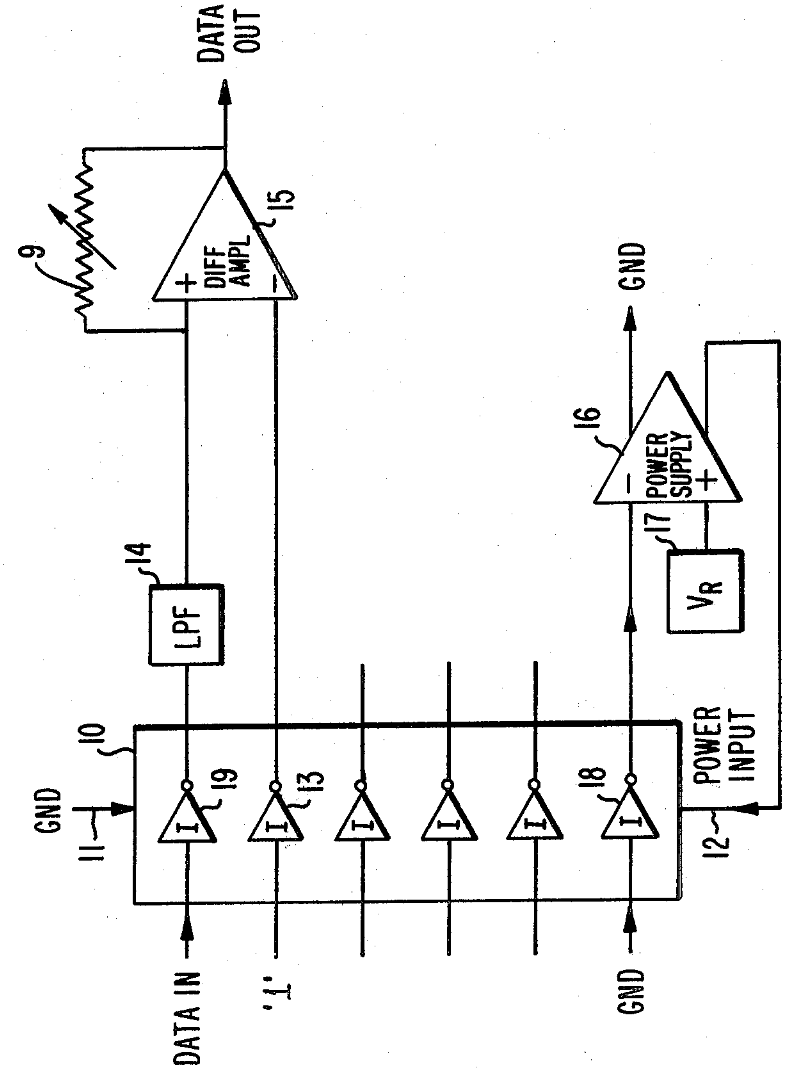
DATA OUT
9
DIFF AMPL
15
GND
16
POWER SUPPLY
17
$V_R$
14
LPF
10
GND
11
19
13
18
POWER INPUT
12
DATA IN
'1'
GND

STABILIZATION OF MONOLITHIC INTEGRATED CIRCUIT OUTPUT LEVELS

This invention relates to signal level conversion and stabilization.

There are many circuits requiring accurate, stabilized level signals. An example of such a circuit is one supplying the driving signals for a transmission modulator in a satellite. The modulating signals may be derived from digital networks that comprise integrated circuits. Each integrated circuit has several circuits on the same substrate. The parameters of all the circuits on the same substrate are usually the same although the parameters among circuits on different substrates may vary widely. Slight variations in manufacturing and changes in temperature cause the parameters among different substrates to vary.

To derive stabilized signals, special integrated circuits with carefully controlled parameters can be used as buffers or level changers in the final stages of the logic network where the signals interface with the utilization circuits. The use of such special circuits increases the number of non-standard items used in a circuit, requiring that special equipment and extra circuits be maintained for repair purposes.

According to one embodiment of the invention, a circuit for stabilizing the output level of a circuit includes a monolithic substrate carrying a plurality of integrated circuits. Each of these circuits has an input means for receiving input signals and an output means for supplying output signals. An input signal is applied to one of the circuits to produce a high valued output signal. The plurality of circuits has a pair of power supply terminals, a first one for providing a voltage return path and a second for receiving voltage. There is also a reference voltage means that supplies a fixed voltage. A power supply having two input terminals for receiving first and second input control signals supplies a voltage, proportional to the difference in potential between the first and second input control signals, which is coupled to the second power supply terminal of the plurality of circuits. The power supply also includes a return means coupled to the first power supply terminal of the plurality of circuits. The fixed voltage is coupled as the first input control signal to the power supply and the high valued output signal from one of the circuits is coupled as the second input control signal to the power supply, the input to the circuit being coupled to the power supply return.

The sole FIGURE of the drawing is a block diagram of a circuit embodying the invention.

In the drawing, an integrated circuit 10 contains six monolithically integrated inverter circuits. This is a typical digital logic commercially available integrated device, used here for illustrative purposes. There are two power supply terminals shown as leads 11 and 12. One of the power leads 12 receives the output voltage from a power supply 16, which has its other terminal coupled to ground. The other power supply terminal of the integrated circuit 10 is also coupled to ground via the lead 11, which supplies the return path to the power supply.

The power supply 16 which may be a difference amplifier of the type SN52771 or SN72771 described in detail on page 3–53 through 3–58 of a publication entitled "The Integrated Circuits Catalog for Design Engineers," published in 1972 by Texas Instruments, Inc., of Dallas, Tex., has two control inputs which determine its output voltage. One of the control inputs is coupled to a reference source 17 and the other to the output terminal of one of the inverters 18 in the integrated circuit 10. The input to the inverter 18 is coupled to ground, causing the output terminal to rise to a voltage determined by the input power supply voltage from the power supply 16. The output voltage from the supply 16 is proportional to the difference between the reference voltage $V_R$ and the output signal from the inverter 18. Difference sensing power supplies are well known in the art and need not be described in detail.

When the output voltage from the inverter 18 decreases because of temperature changes or the like, the output voltage from the power supply 16 is increased, raising the output voltage from the inverter 18 to a predetermined output level, because of the increase in the difference of potential at its input terminals. An increase in the output voltage from the inverter 18 causes a decrease in the output voltage from the power supply 16.

Because the temperature of the entire substrate remains essentially the same and because the circuits on the same substrate have similar characteristics, the output signals from the other inverters will be stabilized at the output voltage established by the inverter 18 when the input signals to the other inverters are at a low level.

To provide accurate and controlled logical one and zero levels of binary data or other values of video signals using the inverter circuits on the integrated circuit 10, a difference amplifier 15 is coupled as shown. The data signal to be stabilized is coupled to the input terminal of an inverter 19 which is coupled to the non-inverting input of the difference amplifier 15. The output terminal from an inverter 13 is coupled to the inverting input of the difference amplifier 15.

When the data input to the inverter 19 is low, the non-inverting input of the amplifier 15 is forced high by the output signal from the inverter 19, the inverting input signal to the amplifier 15 being held low by the forced low output signal from the inverter 13. The output signal from the amplifier 15 will be its high output value. When the data input signal to the inverter 19 is high, its output signal is forced low so that the inverting input signal to the amplifier 15 is the same as the non-inverting input signal. The output signal from the amplifier 15 is thereby driven to its low value.

The level of the high output signal from the amplifier 15 can be adjusted to a desired value by adjusting the feedback impedances of the amplifier in a manner well known in the art.

Such feedback impedances are represented generally by variable impedance 19. Reference is made to pages 3–47 through 3–52 of the above-identified publication by Texas Instruments, which describes in detail difference amplifiers SN52770 and SN2770, either of which is suitable for use in block 15.

A low-pass filter 14 can be inserted between the output terminal of the inverter 19 and the inverting input terminal of the amplifier 15 to reduce transient or high-frequency response, thus stabilizing the output of the amplifier 15 even more.

The integrated circuit 10 need not be inverters, the circuit shown being used for illustrative purposes only. The amplifier 15, power supply 16, and the reference voltage means 17 could be made on the same monolithic array that carries the integrated circuits. In this case, unregulated power connections would be required but such modifications are considered to be within the ordinary skill given the teachings of this disclosure.

What is claimed is:

1. A circuit for stabilizing the output levels from a plurality of substantially independent circuit means formed on a common substrate comprising, in combination:

monolithic substrate means for carrying said plurality of substantially independent circuit means formed thereon, each circuit means having an input means for receiving input signals and an output means for supplying output signals, each of said plurality of circuit means further having a common first power supply terminal means for providing a voltage return path, and a common second power supply terminal means for receiving a voltage;

reference voltage means for supplying a fixed voltage;

means for connecting said voltage return path to the input means of a selected one of said plurality of circuit means, said input signal having a value to produce a high valued output signal on the output means of said selected one of said plurality of circuit means;

said selected one of said plurality of circuit means comprising an inverter; and power supply means separate from said plurality of circuit means and having first and second input terminal means for receiving said fixed voltage and said high valued output signal and having first output means for supplying a voltage proportional to the difference in potential between said fixed voltage and said high valued output signal to said common second power supply terminal means;

said power supply means further comprising voltage return means connected to said common first power supply terminal of said plurality of circuit means.

2. A circuit for stabilizing the output levels from a plurality of substantially independent circuit means formed on a common substrate comprising, in combination:

monolithic substrate means for carrying said plurality of substantially independent circuit means formed thereon, each circuit means having an input means for receiving input signals and an output means for supplying output signals, each of said plurality of circuit means further having a common first power supply terminal means for providing a voltage return path, and a common second power supply terminal means for receiving a voltage;

reference voltage means for supplying a fixed voltage;

means for supplying an input signal to the input means of a selected one of said plurality of circuit means, said input signal having a value to produce a high valued output signal on the output means of said selected one of said plurality of circuit means; and power supply means separate from said plurality of circuit means having first and second input terminal means for receiving said fixed voltage and said high valued output signal and having first output means for supplying a voltage proportional to the difference in potential between said fixed voltage and said high valued output signal to said common second power supply terminal means;

said power supply means further comprising voltage return means connected to said common first power supply terminal of said plurality of circuit means;

a source of unstabilized data signals;

difference amplifier means having first and second input means for producing stabilized data output signals proportional to the difference between the value of signals applied to said first and second input means;

means for coupling said unstabilized input data signals to the input means of a second circuit means;

means for coupling the output signal from said second circuit means to the second input means of said difference amplifier means;

means for applying a signal to the input means of a third circuit means for forcing the output signal from the third circuit means to its low output value; and means for coupling the output means of said third circuit means to the first input means of said difference amplifier means.

3. The invention as claimed in claim 2 wherein said means for coupling the output signal from said second circuit means to said second input means of said difference amplifier includes low-pass filter means for reducing transient signals to said difference amplifier.

4. The invention as claimed in claim 3 wherein said difference amplifier means comprises operational amplifier means having feedback coupling for controlling the gain of said difference amplifier means.

* * * * *